United States Patent
Zha et al.

(10) Patent No.: US 8,339,153 B2
(45) Date of Patent: Dec. 25, 2012

(54) FAULT CURRENT TEST EQUIPMENT OF DIRECT CURRENT THYRISTOR VALVE

(75) Inventors: Kunpeng Zha, Beijing (CN); Chong Gao, Beijing (CN); Jialiang Wen, Beijing (CN); Xingang Zhang, Beijing (CN); Zhiyuan He, Beijing (CN)

(73) Assignee: China Electric Power Research Institute, Beijing (CN)

( * ) Notice: Subject to any disclaimer, the term of this patent is extended or adjusted under 35 U.S.C. 154(b) by 258 days.

(21) Appl. No.: 12/679,301

(22) PCT Filed: Dec. 18, 2009

(86) PCT No.: PCT/CN2009/001507
§ 371 (c)(1),
(2), (4) Date: Mar. 19, 2010

(87) PCT Pub. No.: WO2011/066678
PCT Pub. Date: Jun. 9, 2011

(65) Prior Publication Data
US 2011/0273200 A1    Nov. 10, 2011

(30) Foreign Application Priority Data
Dec. 4, 2009    (CN) .......................... 2009 1 0241331

(51) Int. Cl.
*G01R 31/26*    (2006.01)

(52) U.S. Cl. ............................... 324/762.1; 324/762.07
(58) Field of Classification Search .................. 324/98, 324/96, 42, 762.01–762.1, 764.01; 361/54, 361/98, 96, 42
See application file for complete search history.

(56) References Cited

U.S. PATENT DOCUMENTS 4,133,018 A * 1/1979 Terunuma et al. ............... 361/87
4,745,513 A * 5/1988 McMurray ...................... 361/56

\* cited by examiner

*Primary Examiner* — Tung X Nguyen

(57) ABSTRACT

The present invention relates to a test equipment of direct current thyristor valve, and particularly relates to a fault current test equipment of direct current thyristor valve. This present invention equipment includes high voltage low current circuit and low voltage high current circuit, said test equipment includes fault current circuit, said fault current circuit includes resonant circuit, said high voltage low current circuit, low voltage high current circuit and fault current circuit are all connected with the thyristor sample Vt respectively. In his present invention, the thyristor sample is first heated through the high voltage circuit and low voltage high current circuit to reach the stable state. And then shut off the switch and carries out the test using the fault current which is produced by the fault current circuit. This prevents the power system from the short-circuit impact. Further more, the peak current and the current duration of the fault current circuit can be adjusted flexibly by changing the voltage of the adding energy circuit.

3 Claims, 2 Drawing Sheets

FAULT CURRENT TEST EQUIPMENT OF DIRECT CURRENT THYRISTOR VALVE

RELATED APPLICATIONS

This Application is a United States National Stage Application filed under 35U.S.C. §371 of PCT Patent Application Serial No. PCT/CN2009/001507 filed on Dec. 18, 2009, which claims the benefit of Chinese Patent Application Serial No. 200910241331.3 filed on Dec. 4, 2009, the disclosures of all of which are hereby incorporated by reference in their entirety.

FIELD OF THE INVENTION

The present invention relates to a test equipment of direct current thyristor valve, and particularly relates to a fault current test equipment of direct current thyristor valve.

BACKGROUND OF THE INVENTION

With the increasing application in the power system, the High Voltage Direct Current (HVDC) technology has been a key technology in the safety power system. The HVDC thyristor valve has play a best important role and its stability has been the key factor to ensure the power system safe. The operation test of the thyristor is a primary means to test the HVDC thyristor design and manufacture technology level, improve its stability. The fault current test is one important part of the operation test of the thyristor. The aim of the fault current test is testing whether the maximum current, voltage and temperature effect design proper or not when the short-circuit passes through the thyristor. The test includes two following test mainly:

a) Single wave fault current test with the forward voltage— inhibit one of the largest amplitude single wave fault current, begin with the maximum temperature followed by the closing the reverse voltage and forward voltage including all load over-voltage.

b) Multi-wave fault current test without the forward voltage—under the same condition to the single wave fault current test, the multi-wave fault current will not stop until the circuit breaker trips, but there is no forward voltage in the period and voltage will not be added after last fault current wave pass through.

At present, synthesis methods are generally adopted internationally to carry out the direct current thyristor fault current test. For example, the patent which number is 200810236505.2 provided "a synthesis method of high voltage direct current thyristor operation test". After acquiring the energy from the power system, provide another current source to test the sample thyristor valve. This method adopted independent current source and voltage source. This reduced the test equipment volume and the operation cost. But this method is similar to that of ABB Company and Siemens Company. They all adopted high-current loop six pulse rectifier bridges to provide fault current by simulating the bridges short-circuit, to provide test voltage by resonant high voltage circuit. This method suffered from the following disadvantages: a greater impact on power system, requiring the power support system has a very high short-circuit capacity. This is harmful to the stability of voltage of the power support system, and also easily affects the normal operation of other loads. This greatly reduced the safety and reliability of the test equipment. What's worse, the peak current supplied by the power system and the current duration is adjustable poorly and inflexible.

SUMMARY OF THE INVENTION

Preferred embodiments of the present invention seek to overcome the following disadvantages of the prior equipment: (1) the problem of greater impact on power supply system of the fault current produced in test, (2) high short-circuit capacity requirement for the power supply system, (3) the peak current supplied by the power system and the current duration is adjustable poorly and inflexible. This invention provides equipment that can carry out single wave, multi-wave fault current test. In this method, the equipment will disconnect from the power system when the fault current produces. It can adjust the peak current and the duration of the fault current circuit by changing the adding energy circuit voltage and the resonant circuit parameters.

With this aim in view, the present invention resides in that a fault current test equipment of direct current thyristor valve includes high voltage low current circuit and low voltage high current circuit, said test equipment includes fault current circuit, said fault current circuit includes resonant circuit, said high voltage low current circuit, low voltage high current circuit and fault current circuit are all connected with the thyristor sample Vt respectively.

Another Optimal example of the present invention: said resonant circuit has a switch between the thyristor sample Vt and fault current circuit.

Another Optimal example of the present invention: said high voltage low current circuit includes high voltage circuit, capacitor C, inductor L, isolating valve V21 and isolating valve V22; said high voltage circuit, inductor L and the thyristor sample Vt is series connection, one terminal of said capacitor C links the place between inductor L and high voltage circuit, and another terminal links the place between the thyristor sample Vt and high voltage circuit; said isolating valve V21 and isolating valve V22 are parallel connection and then is series with the place between inductor L and the thyristor sample Vt. Said low voltage high current circuit includes insolating valve V41 and six pulse rectifier bridges, said isolating valve V41, six pulse rectifier bridges and the thyristor sample Vt are series connection and form circuit.

Another Optimal example of the present invention: said fault current circuit includes same and independent resonant circuit A, resonant circuit B and resonant circuit C.

Another Optimal example of the present invention: said resonant circuit A includes adding energy circuit, switch S1, inductor Lr1, isolating V61, the thyristor sample Vt and capacitor C3, they connect together in series; Said resonant circuit B includes adding energy circuit, switch S2, inductor Lr2, isolating V62, the thyristor sample Vt and capacitor C4, they connect together in series; Said resonant circuit C includes adding energy circuit, switch S3, inductor Lr3, isolating V63, the thyristor sample Vt and capacitor C5, they connect together in series.

In this invention, the thyristor sample is first heated by the current though the high voltage circuit and the six pulse rectifier bridges of the high current circuit to meet IEC standards 60700-1 for the fault current before testing. That means the thyristor sample or its components temperature reaches the maximum continuous operation junction temperature of thyristor firstly, and then carries out the test using the fault current which is produced by the fault current circuit. This invention avoids the power system provides linked six pulse rectifier bridges the fault current in the ABB Company and Siemens Company methods, this invention adopts independent fault current production circuit, prevents the power system from the short-circuit impact. This invention has many same independent resonant circuits. The multi-wave of the thyristor sample the can be carried though by controlling the switches. This improves the safety of the equipment. The present invention also has a series of inductors. This reduces the volume and manufacture cost of the equipment. Further more, the peak current and the current duration of the fault current circuit can be adjusted flexibly by changing the voltage of the adding energy circuit.

DETAILED DESCRIPTION OF EMBODIMENTS

Figure 1:
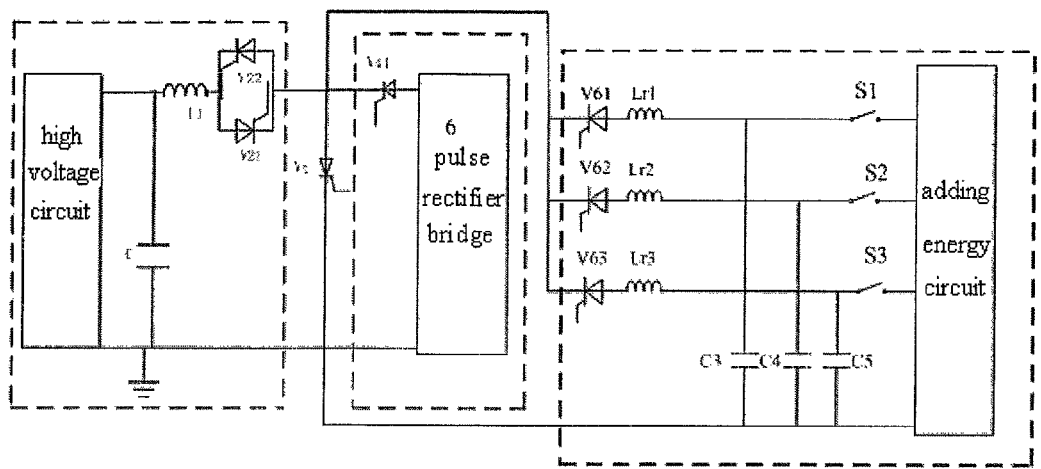
FIG. 1 is the principle diagram of the circuit of the invention equipment.

As FIG. 1 shown, the present invention a fault current test equipment of direct current thyristor valve mainly includes high voltage low current circuit, low voltage high current circuit and fault current circuit three parts. The standards of all circuits including high voltage standard, low voltage standard, high current standard and low current standard are all same to the IEC standard 60700-1. The fault current circuit has many resonant circuits, each resonant circuit is series connected with high voltage low current circuit, low voltage high current circuit and the thyristor sample Vt in orderly. The fault current is supplied by resonant circuit separately. This reduces the volume of the test equipment. The voltage and current of the thyristor sample Vt need are supplied respectively by the high voltage low current circuit and the low voltage high current circuit. The total capacity of voltage and current is less than that supplied by one test equipment. The isolation fault current circuit reduces the impact on the system.

The fault current circuit is placed between the thyristor sample and the power system. It includes resonant circuit A, resonant circuit B and resonant circuit C. The resonant circuit A includes adding energy circuit, switch S1, inductor Lr1, isolating V61, the thyristor sample Vt and capacitor C3, they connect together in series. The resonant circuit B includes adding energy circuit, switch S2, inductor Lr2, isolating V62, the thyristor sample Vt and capacitor C4, they connect together in series. The resonant circuit C includes adding energy circuit, switch S3, inductor Lr3, isolating V63, the thyristor sample Vt and capacitor C5, they connect together in series. The adding energy circuit is used for charging the capacitor C3, capacitor C4 and capacitor C5. Changing the voltage of the adding energy circuit can adjust the discharge voltage of the capacitor C3, capacitor C4 and capacitor C5. This can adjust the peak current of the fault circuit. The continuous current time of the fault circuit also can be adjusted by changing the resonant circuit parameters.

The low voltage high current circuit includes insolating valve V41 and six pulse rectifier bridges. The isolating valve V41, six pulse rectifier bridges and the thyristor sample Vt are series connection and form a circuit.

The high voltage low current circuit includes high voltage circuit, capacitor C, inductor L, isolating valve V21 and isolating valve V22. The high voltage circuit, inductor L and the thyristor sample Vt is series connection, one terminal of the capacitor C links the place between inductor L and high voltage circuit, and another terminal links the place between the thyristor sample Vt and high voltage circuit. The isolating valve V21 and isolating valve V22 are parallel connection and then is series with the place between inductor L and the thyristor sample Vt. The high voltage circuit adds the energy for the capacitor C, this voltage is higher than that of the fault circuit. Furthermore, the voltage can be adjusted according to the actual test and the different thyristor sample.

The working process of the invention a fault current test equipment of direct current thyristor valve is described as below:

First, heat the thyristor sample Vt and carry out the steady state experiment to achieve the standard IEC 60700-1 for the fault current test (the thyristor sample or its components temperature reaches the maximum continuous operation junction temperature of thyristor). Trig the isolating valve V41 in the low voltage high current circuit and start the high current circuit to let the current pass through the thyristor sample Vt. And then trig isolating valves V21/V22 and connect to high voltage low current circuit, add the forward/reverse voltage to the thyristor sample Vt until the voltage stable. The current of the thyristor sample increases to 5000 A, and the voltage reaches 14 kV when the thyristor sample Vt is five thyristor valves. When the thyristor sample Vt is six thyristor valves, the voltage reaches 16 kV. After the thyristor sample or its components temperature reaches the maximum continuous operation junction temperature of thyristor, the fault current test begins. Before the fault current test, charge the capacitor C3, capacitor C4 and capacitor C5 to suitable voltage through the adding energy circuit. Adjust the voltage of the capacitors C according to the different requirement for the fault current peak and the continuous time. The voltage of the capacitors C ranges from 0 to 40 kV. And then disconnect the switch S1, the switch S2 and the switch S3 to avoid the impact on the system and ensure the charge time.

Figure 2:
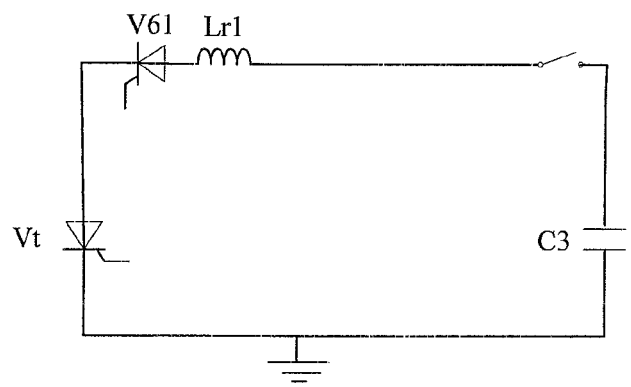
FIG. 2 is the single wave schematic diagram of the resonant circuit.

As FIGS. 1, 2 shown, the isolating valve V61, inductor Lr1 and the capacitor C3 constitute the resonant circuit. The capacitor C3 discharges through the inductor Lr1, the isolating valve V61 and the thyristor sample Vt, and produces a sine fault half-wave current. This sine fault half-wave current is a single wave fault current. It is the fault current that the the thyristor sample Vt need. This described as above is the once single wave fault current test process.

Figure 3:
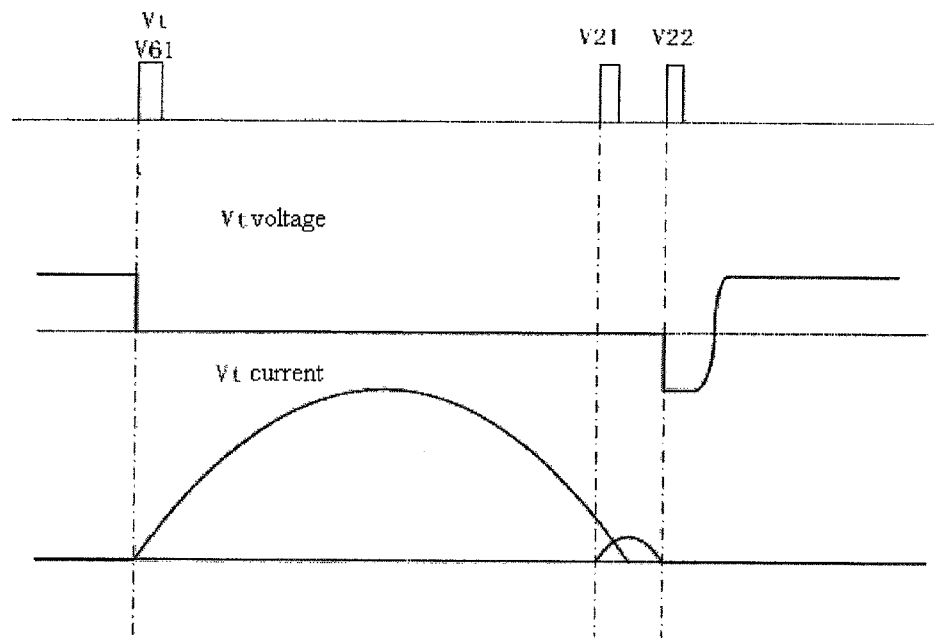
FIG. 3 is the timing diagram of the single wave fault current test.

As FIG. 3 shown, the thyristor valve in single wave test first trigs the isolating valve V61. The inductor Lr1 and the capacitor C3 produce resonance and form a sine fault half-wave current. The current passes through the thyristor sample Vt; and then trigs the isolating valve V21. So the capacitor C and inductor L1 constitute a resonant circuit. This reverses the voltage of the capacitor C. Then trigs isolating valve V22 to add the voltage of the capacitor C onto the thyristor sample Vt. After that, controlling the high voltage adding energy circuit changes the voltage on the capacitor C from a negative to positive voltage. At the same time, trigs the isolating valve V21 to add the positive voltage onto the thyristor sample Vt. Adjust the peak current and make sure it is equal to the actual application voltage on the thyristor. Because in actual condition the voltage waveform on single wave fault thyristor is increasing from the reverse voltage to the forward, triggering the isolating v21 and the isolating V22 makes sure the voltage on the thyristor is equal to the actual condition.

The adding energy circuit voltage in fault current circuit part is continuously adjustable according to the peak current and continuous time requirement in the actual test. The amplitude of the sine half-wave current can be adjusted by changing the voltage on the capacitor C3 which is added by the adding energy circuit. The half-wave oscillating period of the resonant circuit can be adjusted by changing the resonant parameters. The current of the thyristor sample passes through the zero point, and trigs the isolating valve V22, adds negative high voltage onto the thyristor sample Vt. In the high voltage adding energy circuit, the voltage of the capacitor C changes from the negative to the positive, at the same time the isolating valve v21 is trigged and the positive high voltage is add on the thyristor Vt.

Figure 4:
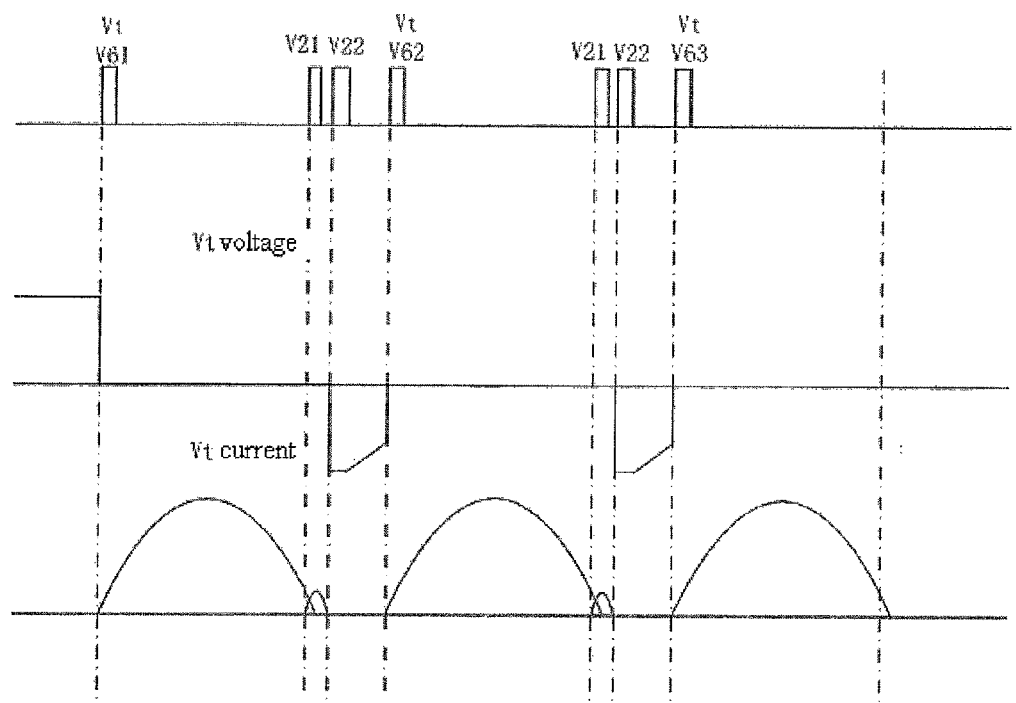
FIG. 4 is the timing diagram of the multi-wave fault current test.

As FIG. 4 shown, the first test process of the multi-wave is same to that of the single wave test. Capacitor C3 is charged, switch S1 is disconnected and the isolating valve V61 is trigged. The first fault current test wave passes through the thyristor sample Vt. During charging the capacitor C3, the voltages of the capacitor C4 and C5 are all charged to 4 kV. The switch S2 and S3 are all shut off when switch S1 is disconnected. And then the second and the third fault current are produced by triggering the isolating V62 and V63 in sequence. Then the current pass through the thyristor sample Vt. At the end of the second and third fault current, a high voltage circuit sine half-wave current is brought in. After the current deceases to zero, the isolating valve V22 is trigged and the capacitor negative voltage is completely added on the thyristor sample Vt. And then the voltage on the capacitor C is reversed through the high voltage adding energy circuit. This operation can accomplish the three fault current tests. In the test, when the capacitor C3, capacitor C4 and capacitor C5 accomplish charge, the switch S1, switch S2 and switch S3 are all isolated with the power system. Therefore, the fault current produced in the test will not impact on the power system. This resolves the high capacity requirement for the power and the easily impact on the power problem.

The trigging timing sequence of the isolating valves is described as below in the multi-wave fault current test: Firstly, the isolating valve V61 is trigged. The fault current circuit inductor Lr1 and capacitor C3 produce a sine half-wave current, and pass through the thyrsitor sample Vt. Secondly, the isolating valve V21 is trigged. The capacitor C and the inductor L1 constitute a resonant circuit. The voltage on the capacitor C is reversed. Thirdly, the isolating valve V22 is trigged. The voltage of the capacitor C is added on the thyristor sample. This ensures that the waveform is same to the negative voltage waveform on the actual used thyristor. (In actual application, the thyristor receives negative voltage after each multi-wave fault current except the third fault current.) and then the voltage of the capacitor C is changed into positive high voltage by the high voltage adding energy circuit. At last, repeat the first test process. The isolating valve V62 and isolating valve V63 are trigged in sequence. The inductor Lr2 and capacitor C4 form a resonant circuit, and the inductor Lr3 and capacitor C5 form a resonant circuit. They produce fault current waves and add it on the thyristor sample Vt, but the third current isn't brought into the high voltage circuit, the current of the capacitor C don't reverse any more, the isolating valve V21 is neither trigged.

The invention claimed is:

1. Fault current test equipment for a direct current thyristor valve, comprising:
    a high voltage low current circuit comprising,
        a high voltage circuit in series with a thyristor sample (Vt);
        a capacitor (C) in series with the high voltage circuit and the thyristor sample (Vt);
        an inductor (L) in series with the high voltage circuit, the capacitor (C), and the thyristor sample (Vt), wherein one terminal of the capacitor (C) links the inductor (L) and the high voltage circuit, and another terminal links the thyristor sample (Vt) and the high voltage circuit;
        an isolating valve (V21) in parallel with an isolating valve (V22), wherein the isolating valve (V21) and the isolating valve (V22) are in series between the inductor (L) and the thyristor sample (Vt);
    a low voltage high current circuit, comprising,
        an isolating valve (V41);
        a pulse rectifier bridge (6), wherein the isolating valve (V41), the pulse rectifier bridge (6), and the thyristor sample (Vt) are coupled in series to form a circuit;
    a fault current circuit comprising a resonant circuit, wherein the high voltage low current circuit, the low voltage high current circuit and the fault current circuit are all connected with the thyristor sample (Vt) respectively; and
    a switch between the thyristor sample (Vt) and the fault current circuit.

2. Fault current test equipment according to claim 1, wherein said fault current circuit includes a resonant circuit (A), a resonant circuit (B) and a resonant circuit (C).

3. Fault current test equipment according to claim 2, wherein:
    resonant circuit (A) comprises,
        an adding energy circuit;
        a switch (S1);
        an inductor (Lr1); and
        an isolating (V61), wherein the thyristor sample (Vt) and the capacitor (C3) are coupled in series;
    the resonant circuit (B) comprises,
        the adding energy circuit;
        a switch (S2);
        an inductor (Lr2);
        an isolating (V62); and
        a capacitor (C4) in series with the thyristor sample (Vt); and
    the resonant circuit (C) comprises,
        the adding energy circuit;
        a switch (S3);
        an inductor (Lr3)
        an isolating (V63); and
        a capacitor (C4) in series with the thyristor sample (Vt).

* * * * *